(12) United States Patent
Katoch et al.

(10) Patent No.: US 11,929,113 B2
(45) Date of Patent: Mar. 12, 2024

(54) VARIABLE VOLTAGE BIT LINE PRECHARGE

(71) Applicant: Taiwan Semiconductor Manufacturing Company, Ltd., Hsinchu (TW)

(72) Inventors: Atul Katoch, Kanata (CA); Adrian Earle, Ontario (CA)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 18/061,320

(22) Filed: Dec. 2, 2022

(65) Prior Publication Data

US 2023/0098852 A1   Mar. 30, 2023

Related U.S. Application Data

(60) Division of application No. 17/175,790, filed on Feb. 15, 2021, now Pat. No. 11,521,673, which is a continuation of application No. 16/545,834, filed on Aug. 20, 2019, now Pat. No. 10,923,182.

(60) Provisional application No. 62/725,698, filed on Aug. 31, 2018.

(51) Int. Cl.
*G11C 7/00* (2006.01)
*G11C 11/4074* (2006.01)
*G11C 11/4094* (2006.01)
*G11C 11/4096* (2006.01)
*G11C 11/411* (2006.01)
*G11C 11/419* (2006.01)

(52) U.S. Cl.
CPC ...... *G11C 11/4094* (2013.01); *G11C 11/4074* (2013.01); *G11C 11/4096* (2013.01); *G11C 11/4113* (2013.01); *G11C 11/419* (2013.01)

(58) Field of Classification Search
CPC .................................................. G11C 7/12
USPC .......................................................... 365/203
See application file for complete search history.

(56) References Cited

U.S. PATENT DOCUMENTS

| | | | |
|---|---|---|---|
| 10,923,182 B2 | 2/2021 | Katoch et al. | |
| 11,521,673 B2 | 12/2022 | Katoch et al. | |
| 2006/0274587 A1 | 12/2006 | Houston | |
| 2013/0258760 A1* | 10/2013 | Hold | G11C 7/227 365/154 |
| 2018/0350429 A1 | 12/2018 | Jeong | |

* cited by examiner

*Primary Examiner* — Hoai V Ho
(74) *Attorney, Agent, or Firm* — Merchant & Gould P.C.

(57) ABSTRACT

A memory device includes an array of memory cells, a bit line connected to the memory cells, and a power supply voltage input terminal configured to receive a power supply voltage at a first voltage level to operate the memory cells at the first voltage level. A bit line precharge circuit has an input terminal configured to receive the power supply voltage at the first voltage level, and the bit line precharge circuit is configured to precharge the bit lines to a second voltage level lower than the first voltage level.

20 Claims, 7 Drawing Sheets

VARIABLE VOLTAGE BIT LINE PRECHARGE

CROSS REFERENCE

This application is a divisional application of U.S. patent application Ser. No. 17/175,790, filed on Jun. 3, 2021, which is a continuation of U.S. patent application Ser. No. 16/545,834, filed on Aug. 20, 2019, now U.S. Pat. No. 10,923,182, which claims the benefit of U.S. Provisional Patent Application No. 62/725,698, filed on Aug. 31, 2018, each of which is incorporated by reference in its entirety.

BACKGROUND

A common type of integrated circuit memory is a static random access memory (SRAM) device. A typical SRAM memory device has an array of memory cells. Each memory cell uses six transistors connected between an upper reference potential and a lower reference potential (typically ground) such that one of two storage nodes can be occupied by the information to be stored, with the complementary information stored at the other storage node. For example, one typical SRAM memory cell arrangement includes six transistors. Each bit in the SRAM cell is stored on four of the transistors, which form two cross-coupled inverters. The other two transistors are connected to the memory cell word line to control access to the memory cell during read and write operations by selectively connecting the cell to its bit lines. In a read operation, for example, the memory cell bit lines are precharged to a predefined threshold voltage. When the word line is enabled, a sense amplifier connected to the bit lines senses and outputs stored information.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
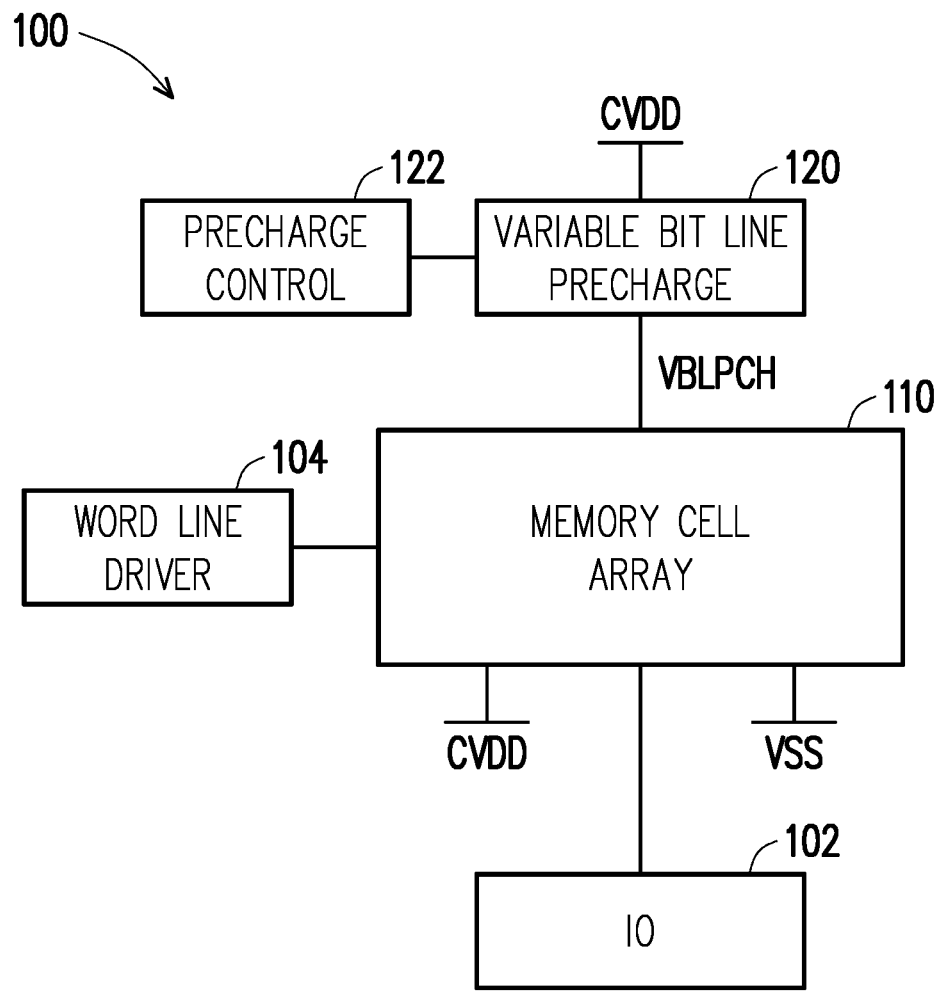
FIG. 1 is a block diagram illustrating an example of a memory device in accordance with some embodiments

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a block diagram illustrating an example of a memory device 100 in accordance with aspects of the present disclosure. In the illustrated embodiment of FIG. 1, the memory device 100 includes a memory cell array 110, a variable bit line precharge circuit 120, a precharge controller 122, an input/output (IO) circuit 102, and a word line driver 104. The memory array 110 includes a plurality of memory cells, and bit lines and word lines are connected to the memory cells of the array 110. In general, a memory address is received and a word line address is provided to the word line driver 104, which generates word line signals that are output to the word lines of the memory cell array 110. The variable bit line precharge circuit 120 is connected to a CVDD voltage terminal, and is configured to precharge the bit lines of the array 110 to a voltage level lower than the CVDD voltage level, VBLPCH, in response to the precharge control circuit 122.

Although, in the illustrated embodiment of FIG. 1, each component is shown as a separate block for the purpose of illustration, in some other embodiments, some or all of the components shown in FIG. 1 may be integrated together. For example, the memory cell array 110 may include an embedded variable bit line precharge circuit 120. The memory cell array has voltage terminals configured to receive a power supply voltage CVDD and ground or VSS voltage.

Figure 2:
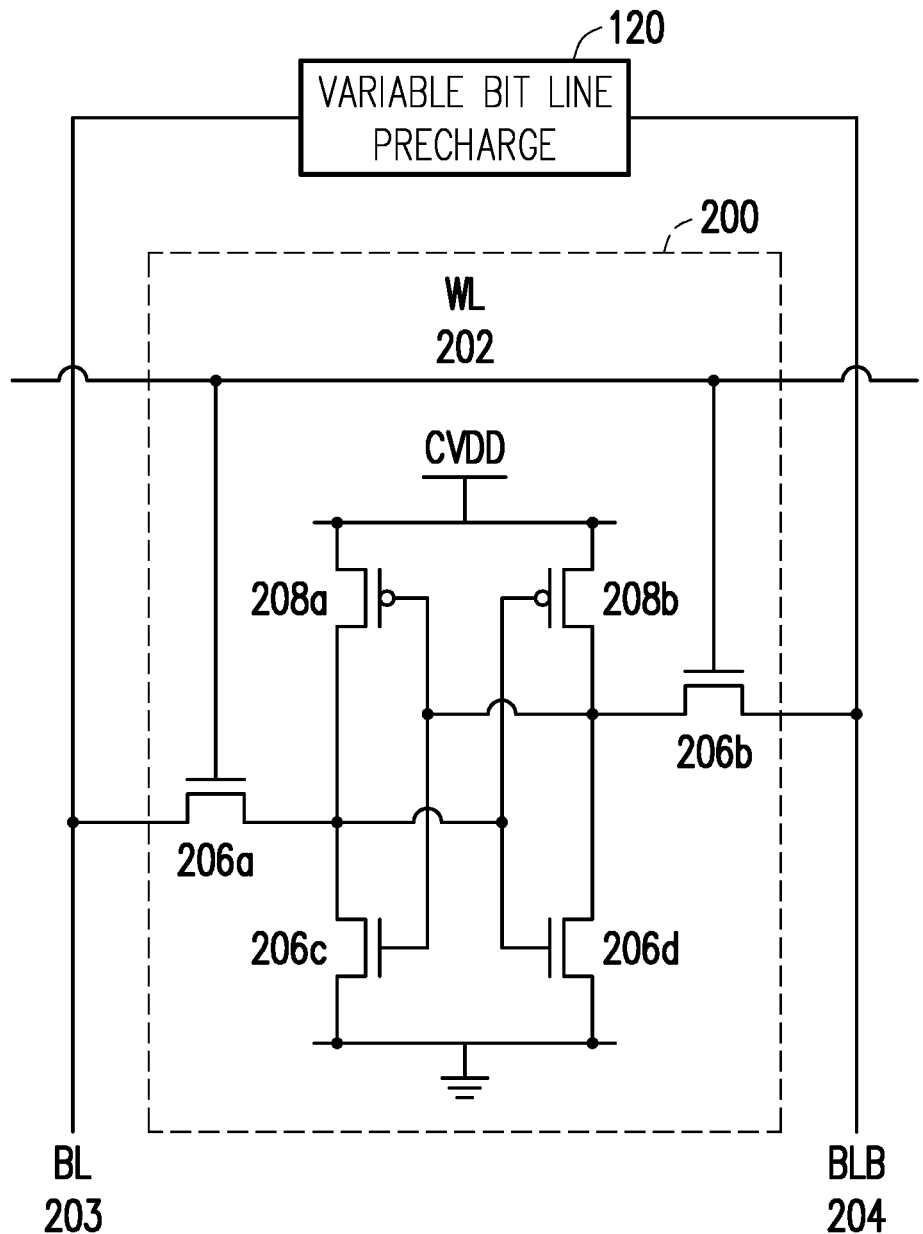
FIG. 2 is a circuit diagram illustrating an example of a static random access memory (SRAM) cell of the memory device shown in FIG. 1 in accordance with some embodiments.

FIG. 2 illustrates an example of a memory cell 200 of the memory cell array 110 shown in FIG. 1. The memory cell 200 is connected to a word line 202 and complementary bit lines BL 203 and BLB 204. The memory cell 200 includes PMOS transistors 208a-b and NMOS transistors 206a-d. The transistors 208a and 206c are coupled to one another and positioned between the supply voltage CVDD 204 and ground to form an inverter. Similarly, the transistors 208b and 206d are coupled between CVDD 220 and ground to form a second inverter.

The two inverters are cross-coupled to each other. An access transistor 206a connects the output of the first inverter to the bit line BL 203. Similarly, the access transistor 206b connects the output of the second inverter to the bit line bar 204. The word line 202 is attached to the gate controls of the access transistors 206a and 206b to selectively couple the outputs of the inverters to the bit lines 203, 204 during read/write operations in response to the word line driver 104 shown in FIG. 1. During a read operation the inverters drive the complementary voltage levels at the bit lines 203, 204.

The cross coupled inverters of the memory cell 200 provide two stable voltage states denoting logic values 0 and 1. Metal-Oxide Semiconductor Field Effect Transistors (MOSFETs) are typically used as the transistors in the memory cell 200. In some embodiments more or fewer than 6 transistors may be used to implement the memory cell 200. As will be discussed further below, the variable bit line precharge circuit 120 is connected to the bit lines 203, 204 and provides for controlling the bit line precharge value.

Figure 3:
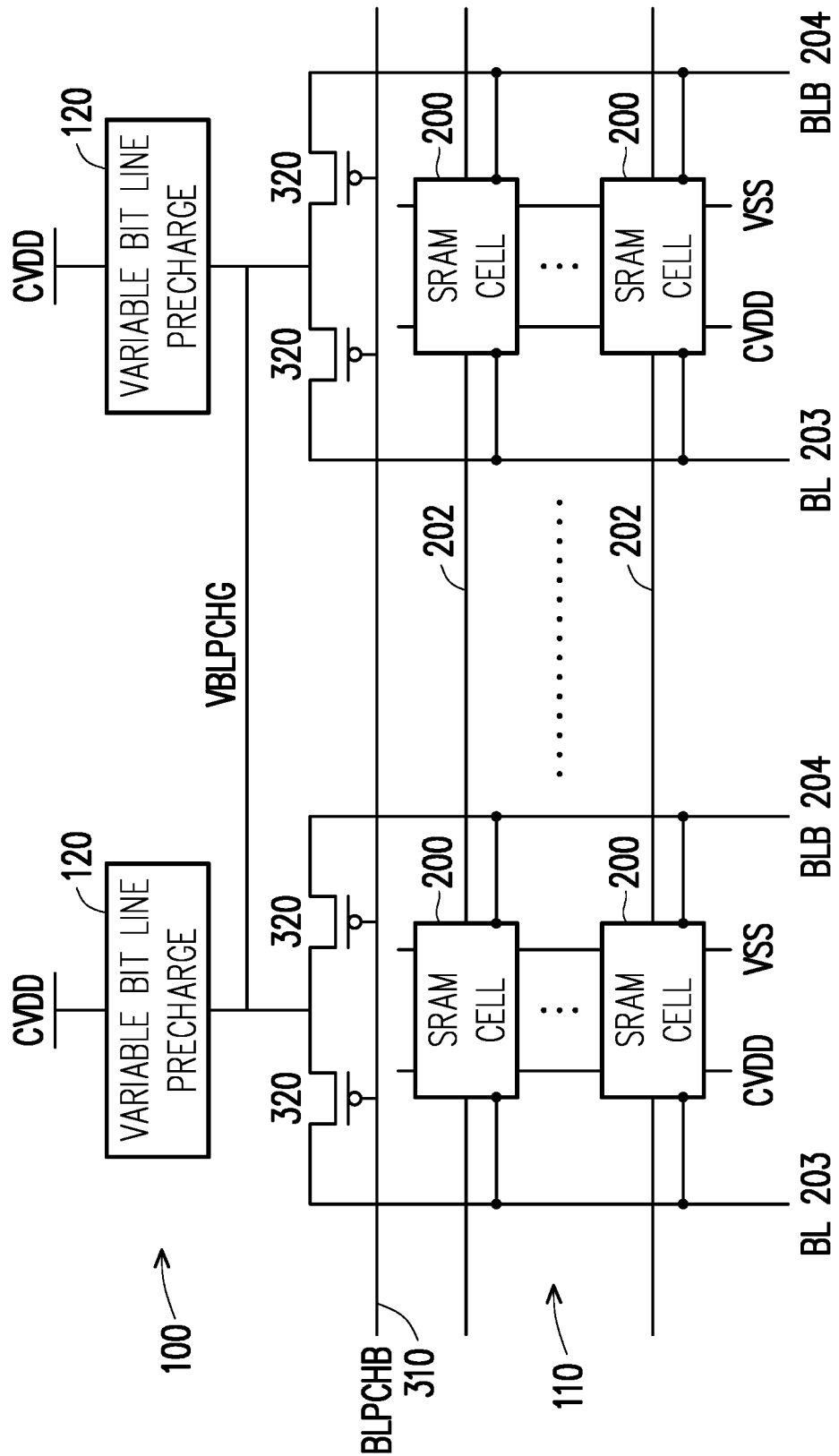
FIG. 3 is a circuit diagram illustrating further aspects of the memory device shown in FIG. 1 in accordance with some embodiments.

FIG. 3 illustrates further aspects of the memory device 100. In some embodiments, the memory cell array 110 includes a plurality of the memory cells 200 arranged in a column-row configuration in which each column has a bit line 203 and a bit line bar 204, and each row has a word line 202. More specifically, the bit lines 203, 204 of each column are respectively coupled to a plurality of the memory cells 200 that are disposed in that column, and each memory cell 200 in that column is arranged on a different row and coupled to a respective (different) word line 202. That is, each memory cell 200 of the memory cell array 110 is coupled to a bit line 203 of a column of the memory cell array 110, a bit line bar 204 of the column of the memory cell array 110, and a word line 202 of a row of the memory cell array 110. In some embodiments, the bit lines 203 and bit lines bar 204 are arranged in parallel vertically and the word lines 202 are arranged in parallel horizontally (i.e., perpendicular to the bit lines 203, 204. Each of the memory cells 200 is connected to the CVDD and VSS voltage terminals.

To improve memory cell stability and improve cell data access speed, memory cell bit lines are often precharged to a predetermine level. The bit line precharge can enhance an access time of the cell data (1,0) by precharging the bit lines with a predetermined voltage level, which is typically the power supply voltage level CVDD, before accessing the cell data. The precharge voltage level should be high enough to provide satisfactory cell stability (i.e., the cell state is maintained without flipping) when the word line 202 WL turns on to access the desired cells 200 of the memory array 110.

As noted above, prior implementations typically use a precharge voltage level ("VBLPCH") equal to the cell voltage level CVDD. However, the memory cells 200 are usually stable when the word line 202 activates even if VBLPCH is at a lower voltage level. In this disclosure, the lowest VBLPCH voltage level where memory cell access remains stable when the word line 202 activates is referred to as VBLPCH_stable.

Thus, VBLPCH may be less than CVDD by some amount. Since it is acceptable to precharge the bit lines at a VBLPCH level lower than CVDD, precharging the bit lines to CVDD (or significantly above VBLPCH_stable) uses more active power than is necessary. In some examples disclosed herein, the VBLPCH is less than CVDD by 300 mV, though other voltage differences between VBLPCH and CVDD are within the scope of the present disclosure.

In accordance with aspects of the present disclosure, various examples utilize a VBLPCH level for precharging the bit lines 203, 204 of the memory array 110 in a range between VBLPCH_stable and CVDD, thus saving power for the over all memory device 100 by using less active power for precharging bit lines.

Further, in some examples the VBLPCH voltage level is selectively varied to improve the precharge speed of the bit lines 203, 204. For instance, for some initial predetermined time period, the bit lines 203, 204 are connected to receive the CVDD voltage level so that the bit lines 203, 204 quickly begin to ramp up to the VBLPCH level. Before the bit lines 203, 204 reach the full CVDD level, however, the bit lines are connected to a lower voltage level so that the bit lines 203, 204 precharge to the lower VBLPCH level. Thus, the bit lines 203, 204 quickly charge for the predetermined time period while connected to the CVDD voltage level, but then are connected to the lower VBLPCH level. Since the bit lines are precharged to a lower voltage level, but charge quickly based on the connection to the higher CVDD voltage, the bit lines 203, 204 may precharge faster than if precharged to the full CVDD voltage level.

Thus, as noted above, the memory cells 200 are connected to the CVDD voltage terminal so as to be operated at the CVDD level. The variable bit line precharge circuit 120 is also coupled to the CVDD terminal, and is configured to precharge the bit lines 202, 203 to the VBLPCH level, which is lower than the CVDD voltage level. More particularly, precharge transistors 320 have gate terminals connected to a bit line precharge bar BLPCHB line 310. When the BLPCHB signal goes low, precharge transistors 320 turn on to connect the bit lines 203, 204 to the VBLPCHG signal output by the variable bit precharge circuit 120.

In some examples, the variable bit line precharge circuit 120 is configured to selectively connect the bit lines 203, 204 directly to the CVDD terminal for a predetermined time period. For instance, at the onset of the precharge operation, the bit lines 203, 204 may be connected to receive the CVDD voltage to improve the precharge speed.

Figure 4:
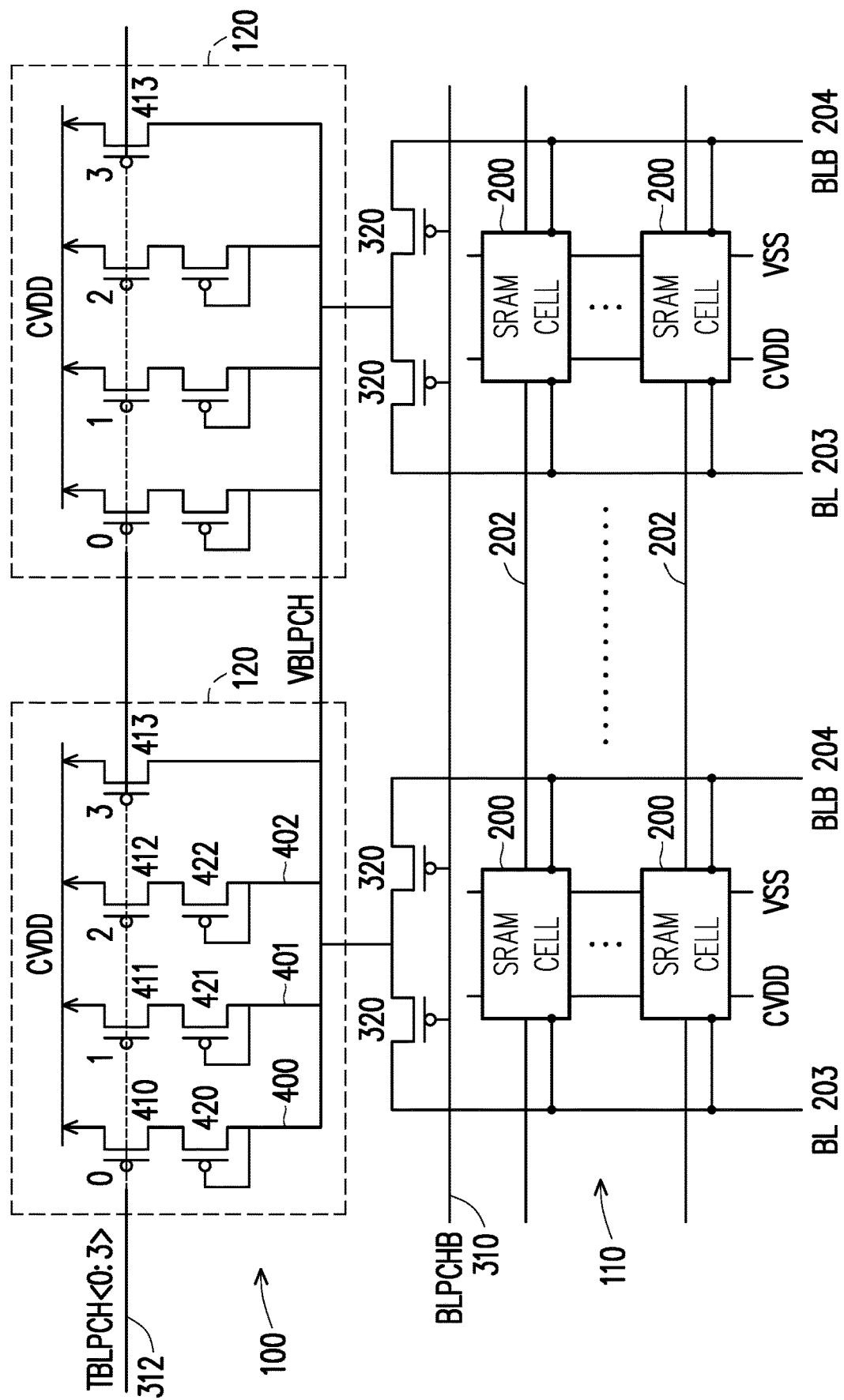
FIG. 4 is a circuit diagram illustrating further aspects of the memory device shown in FIG. 3 in accordance with some embodiments.

FIG. 4 illustrates further aspects of an example of the memory device 100, including an embodiment of the variable bit line precharge circuit 120. In the example shown in FIG. 4, the bit line precharge circuit 120 includes a plurality of power headers configured to selectively vary the VBLPCH voltage level. In the illustrated example the precharge circuit 120 includes four power headers 400, 401, 402, 403. In other embodiments, more or fewer power headers may be employed. Each of the power headers 400, 401, 402, 403 includes a switch 410, 411, 412, 413 configured to selectively connect the plurality of bit lines to the power supply voltage terminal CVDD. In the illustrated embodiment, the switches 410, 411, 412, 413 are PMOS transistors having gate terminals configured to receive a control signal, such as from the precharge controller 122 shown in FIG. 1. In the example of FIG. 4, the gate terminals of the transistors 410, 411, 412, 413 are connected to a trim bit line control line 312 to receive respective trim bit line precharge control signals TBLPCH<0:3>.

In the example of FIG. 4, the switch 413 of the fourth power header 403 is configured to selectively connect the bit lines 203, 204 directly to the CVDD terminal so that the CVDD voltage level is applied to the bit lines 203, 204, such as for high speed operation. Further, the other power headers 400, 401, 402 include respective trim devices 420, 421, 422 connected to the respective switches 410, 411, 412. These switches 410, 411, 412 are operated to selectively connect the bit lines 203, 204 to the CVDD terminal via the trim devices 420, 421, 422. In this manner, a lower voltage level is applied to the bit lines 203, 204, such that the bit lines 203, 204 are precharged to the VBLPCH voltage level, which is lower than CVDD.

In some embodiments the switches are actuated (such as by the precharge controller 122) for predetermined time periods so that the various power headers 400, 401, 402, 403 selectively connect the CVDD voltage to the VBLCH output terminal to achieve the VBLCH voltage level. For example, the switch 413 for the fourth power header 403 may be operated for a first predetermined time period to initially apply a higher voltage level to the bit lines 203, 204 to achieve a faster precharge. The switch 413 is be turned off prior to one or more of the switches 410, 411, 412 of the power headers 400, 401, 402 so that a voltage level less than CVDD is output by the precharge circuit 120.

In the illustrated embodiment, the trim devices 420, 421, 422 are diodes. More particularly, the trim devices 420, 421, 422 in some embodiments are diode-connected PMOS transistors. Moreover, in some implementations, different types of diodes are employed. For example, the voltage threshold type may be varied among the diodes 420, 421, 422, wherein one or more different voltage threshold diodes are employed. Depending on specific requirements, one or more Standard Threshold Voltage (SVT), Low Threshold Voltage (LVT), and/or Ultra Low Threshold Voltage (ULVT) devices may be used in various combinations.

Figure 5:
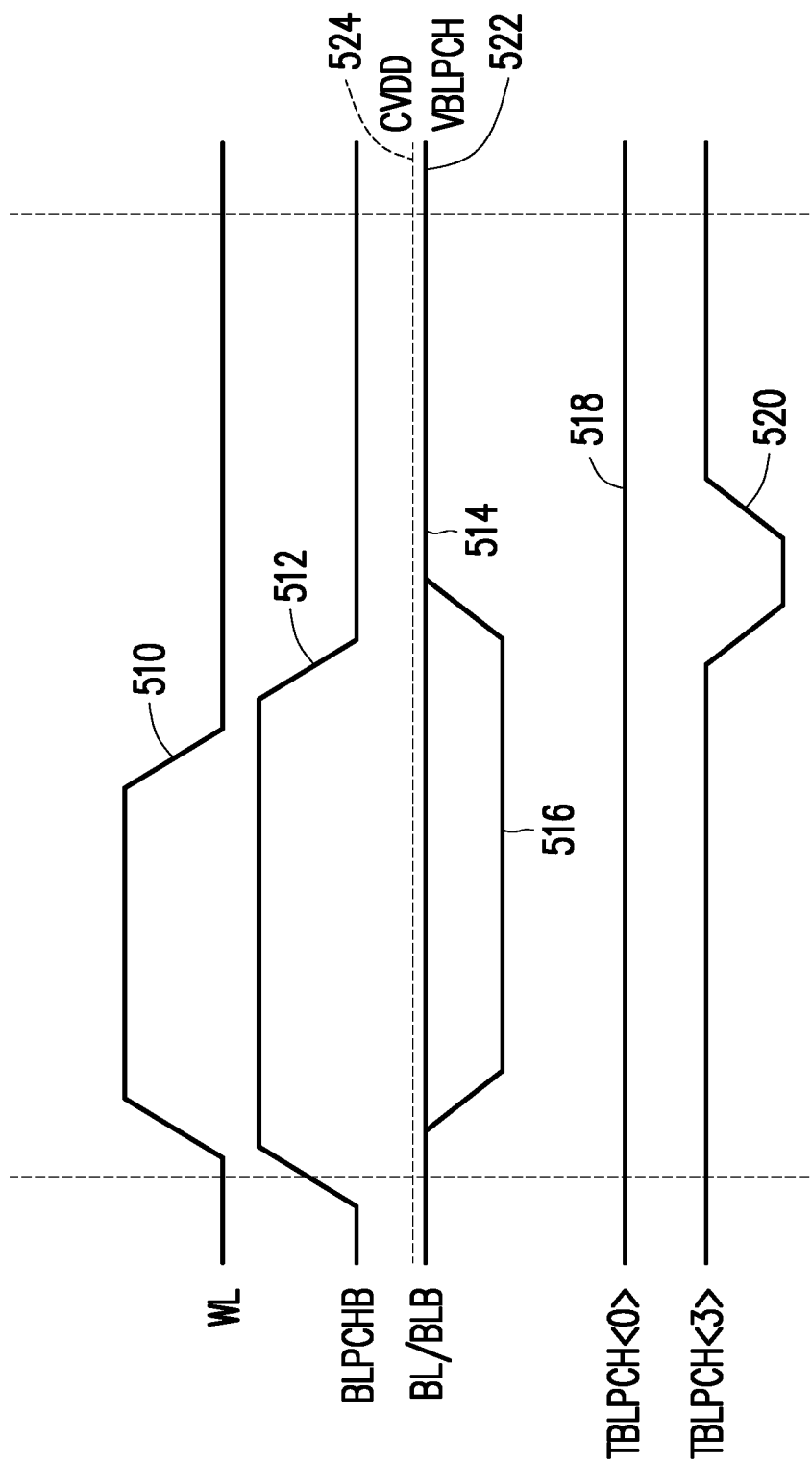
FIG. 5 is a timing diagram illustrating examples of wave forms of the memory device shown in FIG. 4 in accordance with some embodiments.

FIG. 5 illustrates various wave forms associated with operation of the memory device 100. Referring to FIG. 5 in conjunction with FIG. 4, FIG. 5 shows wave forms for the word line signal 510 on the word line 202, the bit line precharge bar BLPCHB signal 512 output on the BLPCHB line 310, the bit line signal 514, bit line bar signal 516, the TBLPCH<3> signal 518 on the trim bit line control line 312 for the fourth power header 403, and the TBLPCH<0> signal 520 on the trim bit line control line 312 for the first power header 400. The TBLPCH<0> signal controls the transistor 410 to selectively connect the VBLPCH line to the CVDD voltage via the diode 420, thus providing a voltage lower than CVDD to the VBLPCH line. For simplicity, FIG. 5 only illustrates wave forms 518 and 520 for the TBLPCH<0> and TBLPCH<3> signals, respectively. It is understood that one or more of the TBLPCH<1:2> signals would also be applied to achieve the desired precharge voltage level.

After the word line assertion signal 510 goes low, the BLPCHB signal 512 goes low to start the bit line precharge. In response to the BLPCHB signal 512 going low, the TBLPCH<0> and TBLPCH<3> signals 518, 520 go low to turn on the transistors 410, 413, connecting the bit lines 203, 204 to the CVDD voltage terminal. The TBLPCH<3> signal turns on the transistor 413 to connect the bit lines 203, 204 directly to the full CVDD voltage for a fast precharge of the bit lines 203, 204 as shown by the corresponding bit line wave forms 514, 516. Note that the TBLPCH<3> signal 520 stays low only for a predetermined time so that the CVDD voltage is only applied to the bit lines 203, 204 for a limited time period. The TBLPCH<0> signal 518 remains low to connect the bit lines 203, 204 to the CVDD voltage terminal though the trim device 420 such that a lower precharge voltage is applied as necessary to achieve the desired VBLPCH voltage level 522, which is lower than the CVDD voltage level 524 as shown in FIG. 5.

Figure 6:
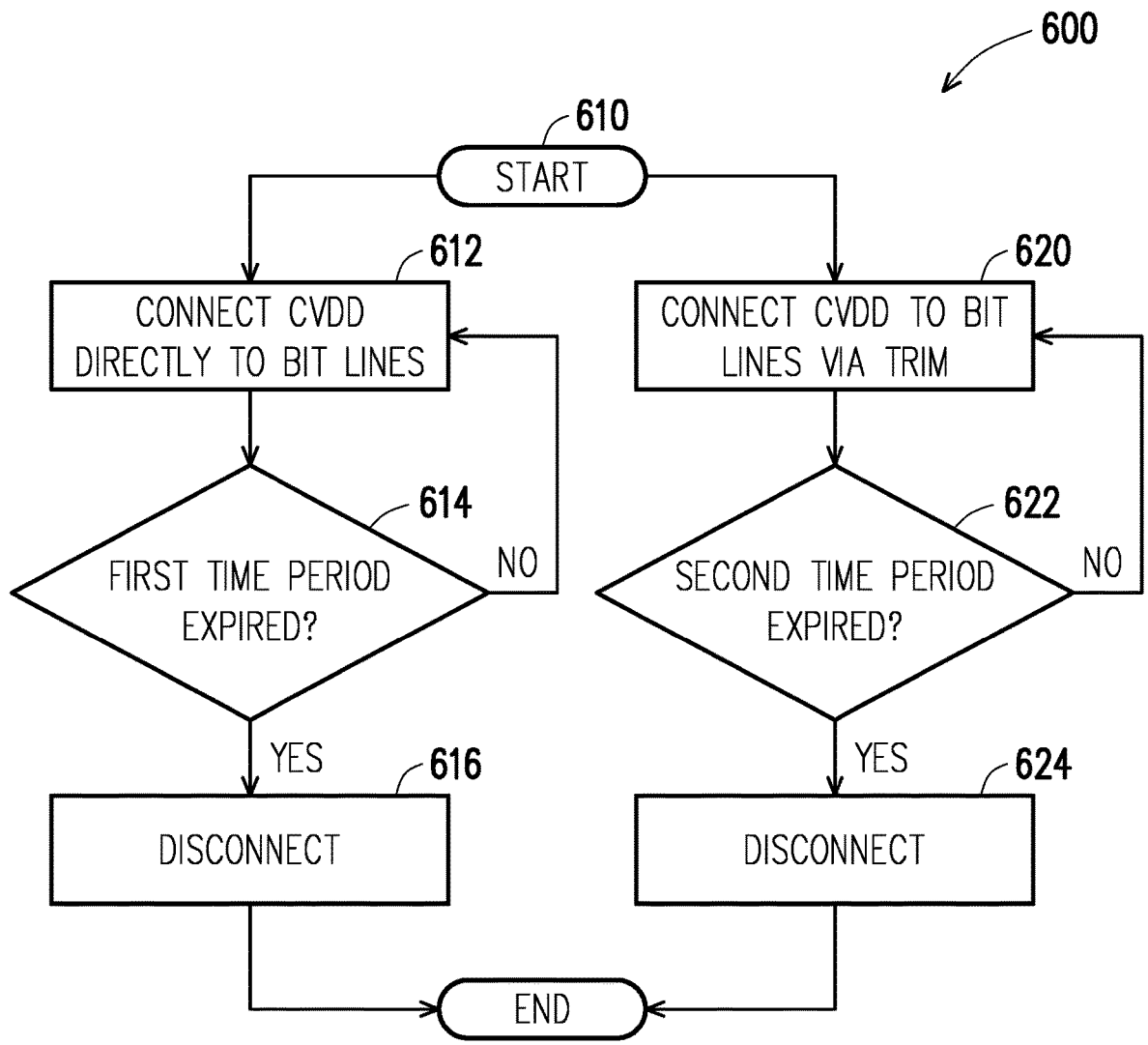
FIG. 6 is a flow diagram illustrating an example of a bit line precharge method in accordance with some embodiments.

FIG. 6 is a flow diagram illustrating aspects of an example precharge method 600 in accordance with disclosed embodiments. The method 600 begins at operation 610. At an operation 612, a power supply voltage such as CVDD is directly connected to the bit lines 203, 204 of the memory array 110 for a predetermined time period, as determined in the decision block 614. As noted above, in the example shown in FIG. 4 this may be accomplished by asserting the TBLPCH<3> signal to activate the transistor 413 for the first predetermined time period to connect the bit lines 203, 204 directly to the CVDD voltage terminal for the first predetermined time period. At the end of the first predetermined time period, the bit lines 203, 204 are disconnected from the CVDD terminal at operation 616, for example, by the TBLPCH<3> signal going high.

At an operation 620, the power supply voltage CVDD is connected to the bit lines 203, 204 of the memory array 110 through one or more trim device(s) 420, 421, 422 for a second predetermined time period, as determined in the decision block 622. This may be accomplished by asserting one or more of the TBLPCH<0:2> signal(s) to activate the desired transistors 410, 411, 412 for the second predetermined time period to connect the bit lines 203, 204 to the CVDD voltage terminal through the trim devices 420, 421, 422 such that a lower voltage than CVDD is applied to the bit lines 203, 204 for the second predetermined time period. At the end of the second predetermined time period, the bit lines 203, 204 the TBLPCH<0:2> signal(s) goes high to disconnect the bit lines 203, 204 from the precharge voltage at operation 624, such that the bit lines 203, 204 are precharged at a precharge voltage VBLPCH that is less than the power supply voltage CVDD.

Figure 7:
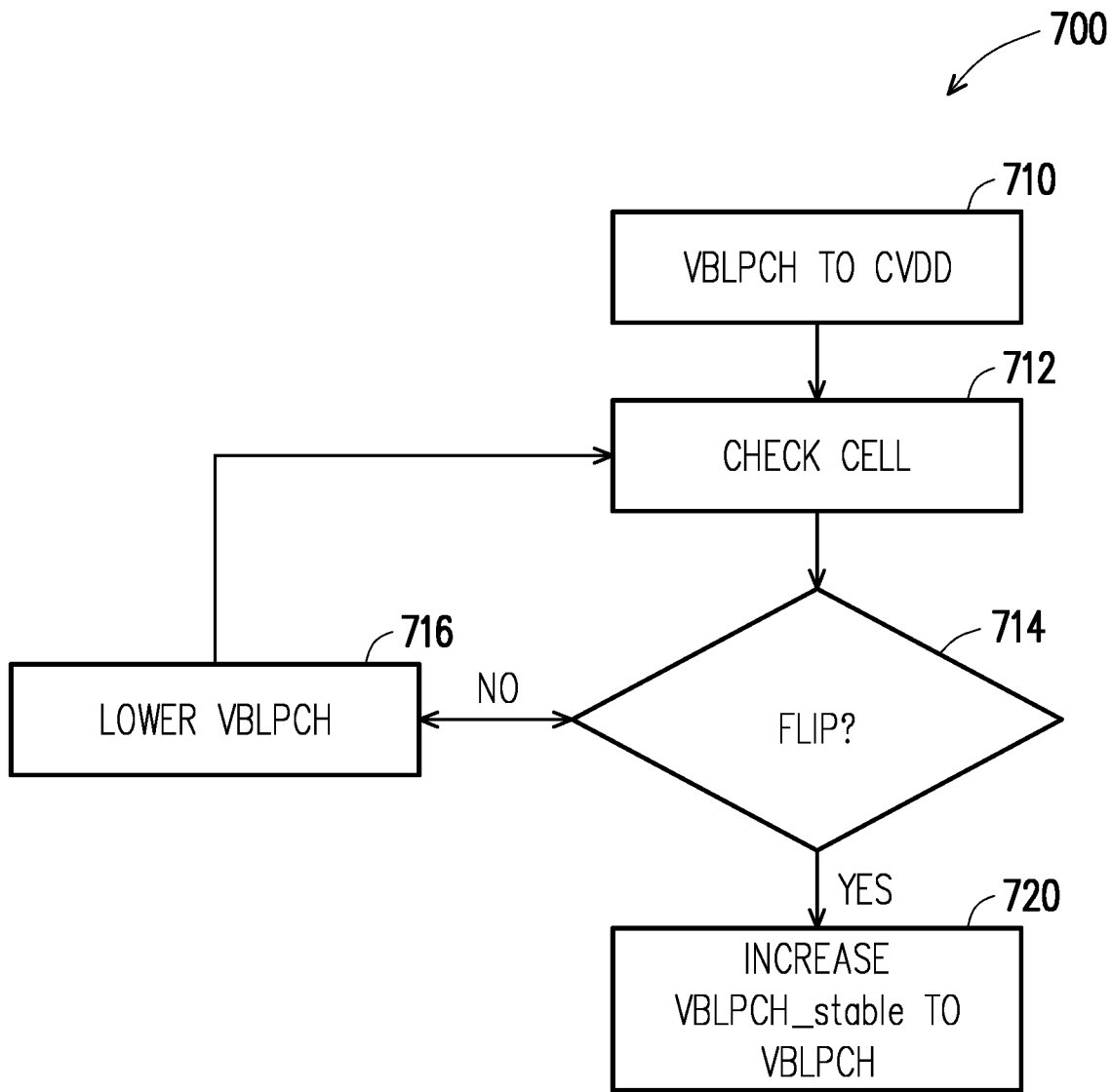
FIG. 7 is a flow diagram illustrating an example of another method in accordance with some embodiments.

The voltage level for VBLPCH is determined by bit cell stability in some examples. FIG. 7 illustrates an example of a process 700 for determining the VBLPCH level. At an operation 710, VBLPCH is initially set at the CVDD level. The memory cell 200 is operated to test stability of the cell at the current VBLPCH level at operation 712. If the cell is stable in decision block 714—it does not "flip" output values—the VBLPCH level is lowered by some predetermined amount in operation 716 and the process is repeated. If the cell flips in decision block 714, or in other words is determined to be unstable, the VBLPCH_stable level has been determined. As noted above, the VBLPCH_stable level is the voltage level where the cell is unstable, or flips. At operation 720, the VBLPCH_stable voltage level is increased by a predetermined amount to set the VBLPCH voltage level at the predetermined amount over the VBLPCH_stable level where the cell was unstable. In other words, the VBLPCH level is set at a level where the cell does not flip, or is stable.

In some examples, various testing algorithms such as a monte-carlo test where repeated random sampling is employed to check cell flips. If the memory cells 200 of the array 110 do not flip, VBLPCH is lowered by 10 mV and the analysis is repeated. In other implementations, the VBLPCH is lowered by 5-15 mV. Once memory cell flips are observed, the VBLPCH_stable voltage is increased by 20 mV to set the VBLPCH voltage level above the level where flips were observed. In other examples, the VBLPCH_stable voltage is increased by 10-30 mV; other values are within the scope of the disclosure.

Thus, aspects of the present disclosure provide a bit line precharge at a lower voltage, saving power usage of the memory device, while allowing for a fast precharge. Disclosed embodiments include a memory device that has an array of memory cells with a bit line connected to the memory cells. A power supply voltage input terminal is configured to receive a power supply voltage at a first voltage level to operate the memory cells at the first voltage level. A bit line precharge circuit has an input terminal configured to receive the power supply voltage at the first voltage level. The bit line precharge circuit is configured to precharge the bit lines to a second voltage level lower than the first voltage level.

In accordance with further disclosed embodiments, a bit line precharge circuit includes an input terminal configured to receive a power supply voltage at a first voltage level. An output terminal is configured to output a precharge voltage to a plurality of bit lines of a memory array. A first power header has a first switch configured to selectively connect the output terminal to the input terminal, and a second power header has a trim device and a second switch configured to selectively connect the output terminal to the input terminal via the trim device.

In accordance with still further disclosed embodiments, a method for pre-charging bit lines of a memory array includes connecting a power supply voltage to a plurality of bit lines of a memory array for a first predetermined time period. The power supply voltage is connected via a trim device to the bit lines for a second predetermined time period that is shorter than the first predetermined time period to precharge the bit lines at a precharge voltage that is less than the power supply voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
providing a memory array including a memory cell connected to a bit line;
setting a precharge voltage at a first voltage level;
precharging the bit line to the first voltage level;
determining whether a data value of the memory cell has flipped from an initial value; and
if the data value of the memory cell has not flipped, then reducing the precharge voltage to a second voltage level lower than the first voltage level.

2. The method of claim 1, wherein if the data value of the memory cell has flipped, then increasing the precharge voltage to a third voltage level higher than the first voltage level.

3. The method of claim 1, further comprising:
after reducing the precharge voltage to the second voltage level, precharging the bit line to the second voltage level;
determining whether the data value of the memory cell has flipped from the initial value; and
if the data value of the memory cell has not flipped, then reducing the precharge voltage to a third voltage level lower than the second voltage level.

4. The method of claim 3, wherein if the data value of the memory cell has flipped, then increasing the precharge voltage to a fourth voltage level higher than the second voltage level.

5. The method of claim 1, wherein precharging the bit line to the first voltage level includes connecting the bit line to a power supply voltage terminal receiving the first voltage level.

6. The method of claim 5, wherein then reducing the precharge voltage to the second voltage level includes connecting the bit line to the power supply voltage terminal via a trim device.

7. The method of claim 6, wherein connecting the bit line to the power supply voltage terminal via the trim device includes operating a first switch connected between the power supply voltage terminal and the bit line.

8. A memory precharge system, comprising:
a power supply voltage input terminal configured to receive a power supply voltage at a first voltage level;
a bit line precharge circuit having an output terminal configured to output a second voltage level lower than the first voltage level and precharge a memory bit line to the second voltage level,
wherein the second voltage level is determined by:
setting a precharge voltage at the first voltage level;
precharging the memory bit line to the first voltage level;
determining whether a data value of the memory cell has flipped from an initial value; and
if the data value of the memory cell has not flipped, then reducing the precharge voltage to the second voltage level lower than the first voltage level.

9. The memory precharge system of claim 8, wherein if the data value of the memory cell has flipped, then increasing the precharge voltage to a third voltage level higher than the first voltage level.

10. The memory precharge system of claim 8, wherein the second voltage level is further determined by:
after reducing the precharge voltage to the second voltage level, precharging the bit line to the second voltage level;
determining whether the data value of the memory cell has flipped from the initial value; and
if the data value of the memory cell has not flipped, then reducing the precharge voltage to a third voltage level lower than the second voltage level.

11. The memory precharge system of claim 10, wherein if the data value of the memory cell has flipped, then increasing the precharge voltage to a fourth voltage level higher than the second voltage level.

12. The memory precharge system of claim 8, wherein precharging the bit line to the first voltage level includes connecting the bit line to a power supply voltage terminal receiving the first voltage level.

13. The memory precharge system of claim 12, wherein then reducing the precharge voltage to the second voltage level includes connecting the bit line to the power supply voltage terminal via a trim device.

14. The memory precharge system of claim 13, wherein connecting the bit line to the power supply voltage terminal via the trim device includes operating a first switch connected between the power supply voltage terminal and the bit line.

15. A method, comprising:
providing a memory array including a memory cell connected to a bit line;
precharging the bit line to a first voltage level;
determining whether a data value of the memory cell has flipped from an initial value; and
if the data value of the memory cell has flipped, then increasing the precharge voltage to a second voltage level.

16. The method of claim 15, wherein if the data value has not flipped, then decreasing the precharge voltage to a third voltage level lower than the first voltage level.

17. The method of claim 16, further comprising:
after reducing the precharge voltage to the third voltage level, determining whether the data value of the memory cell has flipped from the initial value; and if the data value of the memory cell has not flipped, then
reducing the precharge voltage to a fourth voltage level lower than the third voltage level.

18. The method of claim 15, wherein precharging the bit line to the first voltage level includes connecting the bit line to a power supply voltage terminal receiving the first voltage level.

19. The method of claim 17, wherein precharging the bit line to a first voltage level includes connecting the bit line to the power supply voltage terminal via a trim device.

20. The method of claim 17, wherein connecting the bit line to the power supply voltage terminal via the trim device includes operating a first switch connected between the power supply voltage terminal and the bit line.

* * * * *